(12) United States Patent
Kuramitsu et al.

(10) Patent No.: US 6,602,370 B1
(45) Date of Patent: Aug. 5, 2003

(54) METHOD OF MANUFACTURING CERAMIC ELECTRONIC COMPONENTS

(75) Inventors: Hideki Kuramitsu, Osaka (JP); Atsuo Nagai, Osaka (JP); Yoshiya Sakaguchi, Kyoto (JP); Yoshiyuki Miura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 71 days.

(21) Appl. No.: 09/786,729

(22) PCT Filed: Jul. 21, 2000

(86) PCT No.: PCT/JP00/04868

§ 371 (c)(1),
(2), (4) Date: May 17, 2001

(87) PCT Pub. No.: WO01/08177

PCT Pub. Date: Feb. 1, 2001

(30) Foreign Application Priority Data

Jul. 28, 1999 (JP) .............................. 11-213297

(51) Int. Cl.$^7$ .............................. H01G 4/12; H01G 4/30
(52) U.S. Cl. .................... 156/89.12; 156/230; 156/235; 156/247; 29/851
(58) Field of Search .................... 156/89.11, 89.12, 156/234, 235, 247, 277, 289, 230; 29/830, 831, 851

(56) References Cited

U.S. PATENT DOCUMENTS 5,009,744 A * 4/1991 Mandai et al. ............... 216/6
5,412,865 A * 5/1995 Takaoka et al. ............... 29/830

FOREIGN PATENT DOCUMENTS

| EP | 0 381 879 | 8/1990 |
| EP | 0 522 622 A1 | 1/1993 |
| JP | 01-208824 | 8/1989 |
| JP | 04-196007 | 7/1992 |
| JP | 5-190043 | 7/1993 |
| JP | 6-333774 | 12/1994 |
| JP | 11-111560 | 4/1999 |

* cited by examiner

Primary Examiner—Michael W. Ball
Assistant Examiner—John T. Haran
(74) Attorney, Agent, or Firm—McDermott, Will & Emery (57) ABSTRACT

A method of manufacturing a ceramic electronic component including: a first step of providing a plurality of ceramic sheets containing ceramic powder and polyethylene and having a porosity of 30% or more, and a conductor layer containing metal powder, plasticizer and resin on a base film; a second step of laminating and pressurizing the conductor layer together with the base film on one of the ceramic sheets, and peeling off the base film to form a ceramic sheet with the conductor layer; a third step of disposing another ceramic sheet on top of the conductor layer; a fourth step of laminating and pressurizing another conductor layer on top of the another ceramic sheet; a fifth step of repeating the third and the fourth steps to form a laminated body having a desired number of layers; and a sixth step of sintering the laminated body.

22 Claims, 5 Drawing Sheets

001
METHOD OF MANUFACTURING CERAMIC ELECTRONIC COMPONENTS

FIELD OF THE INVENTION

The present invention relates to a method of manufacturing ceramic electronic components such as multi-layered ceramic capacitors and the like.

BACKGROUND ART

Figure 8:
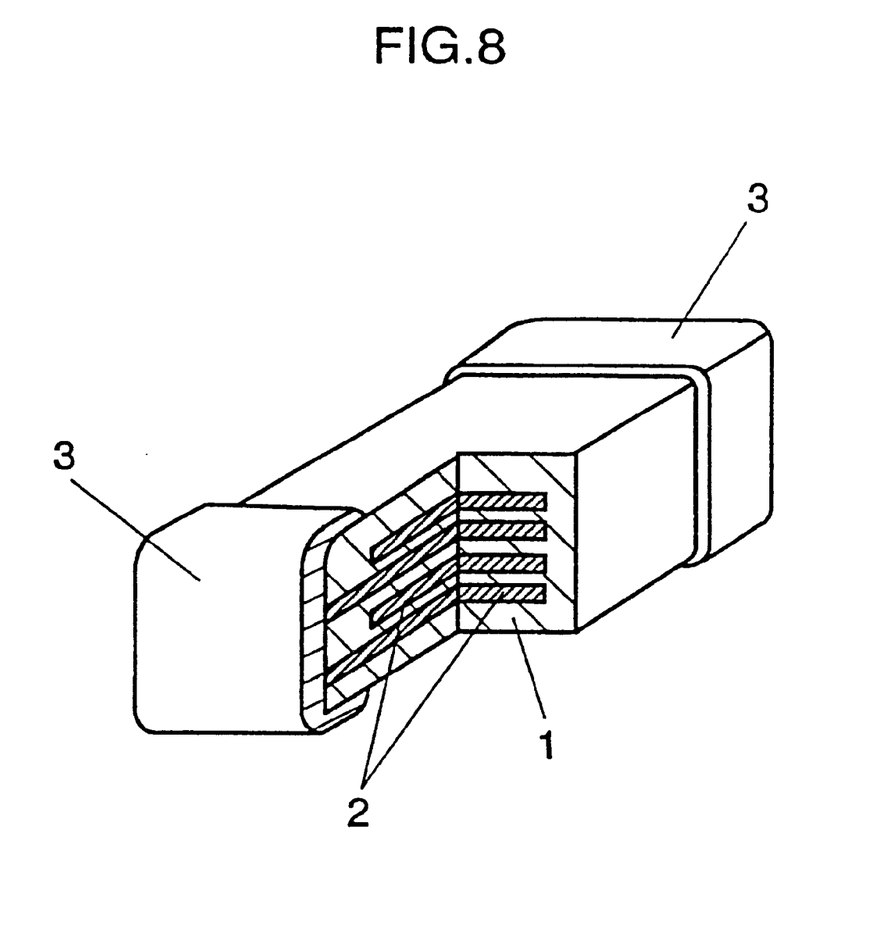
FIG. 8 is a partially cut-away perspective view of a conventional multi-layered ceramic capacitor.

A multi-layered ceramic capacitor, which one of a line among the ceramic electronic components, is shown in a partially cut-away perspective view in FIG. 8. The multi-layered ceramic capacitor comprises a plurality of dielectric layers 1, a plurality of conductive layers 2 and at least two external electrodes 3. Each of the conductive layers 2 is connected alternately to respective electrode among the two external electrodes 3.

A conventional method of manufacturing multilayered ceramic capacitors is described below.

Metallic paste, which later becomes the conductive layer 2, is printed through a printing process in a certain specific pattern on a ceramic sheet, or the dielectric layer 1. A plurality of the ceramic sheets having the metallic paste printed thereon are stacked together so that the conductive layers 2 face to each other with a ceramic sheet interposing in between, for forming a multi-layered body.

Then the multilayered body is sintered, and then the external electrode 3 is provided at both ends of the sintered body covering the exposed conductive layers 2.

Recently, thickness of the dielectric layer is becoming thinner in order to increase the capacitance of a multi-layered ceramic capacitor. An example of the thinner dielectric layer is disclosed in the Japanese Patent Laid-open Publication No. H5-190043, which discloses a ceramic sheet formed of polyethylene and ceramic component.

The ceramic sheet, however, has a significantly high porosity as compared with generally used ceramic sheets manufactured with ceramic component and vehicle (organic components such as resin, plasticizer and organic solvent). As a result, if the sheets are used in a conventional manufacturing procedure for multi-layered ceramic capacitors, the sheet allows the metal component printed thereon to permeate into the ceramic sheet.

A problem with the conventional manufacturing method is short-circuiting between the conductive layers 2 caused by the metallic component permeated inside the ceramic sheet.

The problem is not specific to the multi-layered ceramic capacitors, but it has been shared also by other kinds of multi-layered ceramic components. The present invention addresses the above problem, and aims to provide a method of manufacturing ceramic electronic components that eliminates defects due to the short-circuiting.

DISCLOSURE OF THE INVENTION

A method of the present invention for manufacturing ceramic electronic components comprises the following processing steps;
- a first process for providing a ceramic sheet containing at least ceramic component and polyethylene and providing a conductive layer containing metal component and vehicle therefor and is formed on a base film;
- a second process for stacking said conductive layer formed on said base film on said ceramic sheet so that the conductive layer makes contact with the ceramic sheet and pressing them from above the base film, and then peeling the base film off;
- a third process of disposing said ceramic sheet on the conductive layer;
- a fourth process for stacking said conductive layer formed on said base film on the ceramic sheet and pressing them from above the base film, and then peeling the base film off;
- a fifth process for forming a laminated body by repeating said third process and said fourth process; and
- a sixth process of sintering the laminated body.

Since the metallic paste is not printed directly on a ceramic sheet, but it is first printed on a base film to form a conductive layer and then the conductive layer is transferred on a ceramic sheet, the metallic paste is prevented from permeating into the ceramic sheet during printing. Namely, intrusion of conductive layer into ceramic sheet is suppressed.

With the manufacturing method of present invention, the defects due to short-circuit between the electrode layers can be avoided among the multi-layered ceramic electronic components. Production yield may be increased. The method of manufacturing of the present invention is significantly effective with production of multi-layered chip capacitors, where thickness of ceramic sheet is very thin and the number of stacked layer is large.

PREFERRED EMBODIMENTS FOR CARRYING OUT THE INVENTION

Exemplary embodiments of the present invention are described below with an example of multi-layered ceramic capacitor with referring to the drawings.

First Embodiment

FIG. 1–FIG. 6 illustrate cross sectional views used to describe stacking process with multi-layered ceramic capacitor in accordance with a first exemplary embodiment of the present invention. In the respective drawings, numerals 10, 11, 12, 13 and 14 denote ceramic sheet, conductive layer, base film, metal press plate and provisional laminated body, respectively.

Figures 1A, 1B:
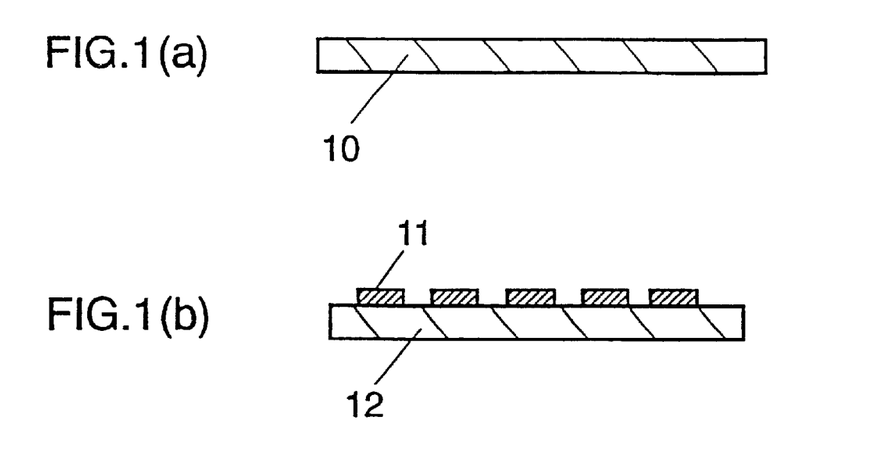
FIG. 1(a) is a cross sectional view of a ceramic sheet in an exemplary embodiment of the present invention.
FIG. 1(b) is a cross sectional view of a conductive layer in an exemplary embodiment of the present invention.

In the first place, as shown in FIG. 1(a), a plurality of ceramic sheets 10 made of polyethylene of more than 400,000 weight-average molecular weight (hereinafter referred as Mw) and dielectric powder containing barium titanate as the main component, with 50% porosity and 10 μm thick, are provided.

A metallic paste prepared separately is printed in a certain specific pattern on the surface of base film 12 made of polyethylene terephthalate (PET) or the like film, as shown in FIG. 1(b), followed by a drying. In this way, a plurality of 2.5 μm thick conductive layers 11 are provided.

The above metallic paste may be composed of platinum, gold, palladium, nickel or copper, or the like metals. In the present embodiment, Nickel is used. For a resin of the metallic paste, a cellulose derivative resin such as ethyl cellulose, acrylic resin, butyral resin or a mixture of these materials is used. For a plasticizer of metallic paste, a phthalic acid ester plasticizer such as benzyl butyl phthalate is used. For a solvent, an alcoholic, ester keton type, an aliphatic or an aromatic solvent is used.

Materials for the base film 12 is selected from the materials which is not deformed or decomposed by the pressure or heat applied during the subsequent processes. Considering the cost and the availability in the market, PET or PEN (polyethylene naphthalate) is suitable. In the present embodiment, PET is used.

Most of the solvent contained in the conductive layer 11 evaporates during the drying process after the paste is printed, and its surface becomes hard. Thus the conductive layer 11 becomes substantially metallic components and organic components (bonding agent) consisting of plasticizer and resin.

The bonding agent contained in conductive layer 11 should preferably be 5–15 parts by weight (hereinafter referred as parts), more preferably 8–12 parts, against 100 parts of metal component at the moment when it makes contact with the ceramic sheet 10. The reason is that: if the bonding agent is less than 5 parts, the adhesion between conductive layer 11 and ceramic sheet 10 becomes poor, on the other hand if it exceeds 15 parts, the metallic paste becomes too tacky to provide the conductive layer 11 exactly in a certain desired pattern on ceramic sheet. Besides, too much bonding agent necessitates redundant time and oxygen for removing the bonding agent.

Figure 2:
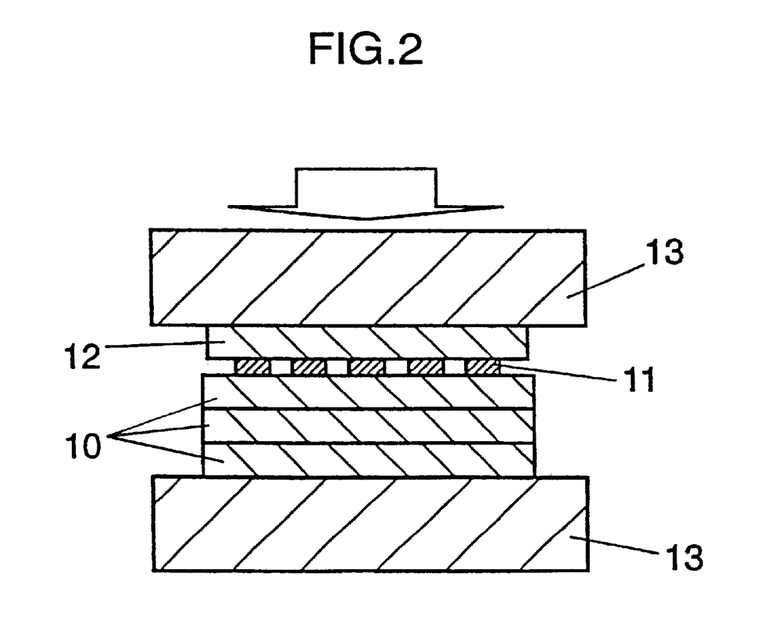
FIG. 2 is a cross sectional view illustrating a process of stacking in an exemplary embodiment of the present invention.

Next, as shown in FIG. 2, a plurality of ceramic sheets 10 are disposed stacked on the lower press plate 13 to be pressed together by the upper press plate 13, for providing dummy layer. The conductive layer 11 on the base film 12 is placed on the dummy layer so that the conductive layer 11 makes direct contact to ceramic sheet 10. Then, they are pressed altogether between the upper and the lower press plate 13 with the base film 12. The conductive layer 11 and the ceramic sheet 10 stick together by the pressing. During the pressing, it is preferred that they are heated at a temperature not lower than softening temperature of the bonding agent contained in the conductive layer 11 and, at the same time, a temperature lower than one of the softening point of polyethylene and decomposition temperature of the bonding agent.

In the conventional method where conductive paste is printed directly on ceramic sheet 10, adhesive strength between the conductive layer 11 and the ceramic sheet 10 is sufficiently high. However, in the present invention where a conductive layer 11 is once formed on the surface of a base film 12 and then it is affixed to a ceramic sheet by pressing, a limited amount of bonding agent needs to be efficiently utilized. The adhesion between ceramic sheet 10 and conductive layer 11 can be enhanced by heat pressing them together in the above-described temperature range.

When the heating temperature is too high, the plasticizer bleeds away to make the conductive layer 11 hard and brittle, and the adhesive strength between ceramic sheet 10 and conductive layer 11 deteriorates. This invites the structural failure in the laminated body during stacking or sintering process. If the resin is decomposed, adhesion between the ceramic sheet 10 and the conductive layer 11 becomes insufficient. Furthermore, if the heating temperature is higher than softening point of polyethylene, the polyethylene shrinks and it becomes difficult to make the laminated body precisely in a certain specific shape. In view of the above, it is preferred to control the heating temperature during pressing within the above-described temperature range.

Figure 3:
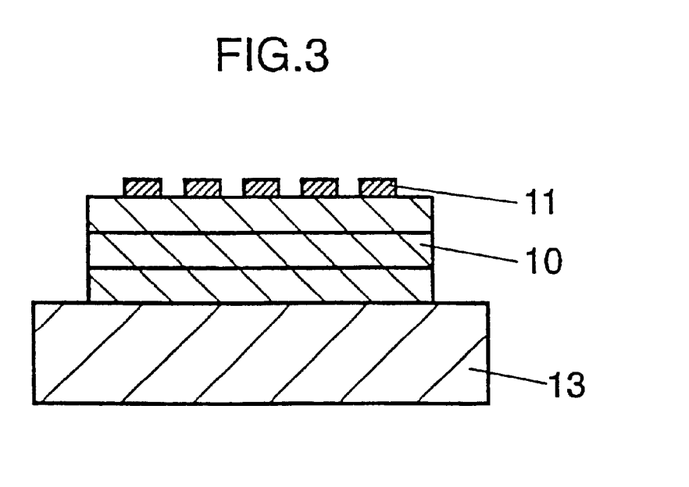
FIG. 3 is a cross sectional view illustrating a process of stacking in an exemplary embodiment of the present invention.

Next process is separating the base film 12 from the conductive layer 11, as illustrated in FIG. 3. In order to make the separating operation easier, it is effective to provide a release layer (not shown) on the surface of the base film 12 before forming a conductive layer 11 thereon. Material for the release layer may be selected from at least one of the group of acrylic resin, melamine resin, epoxy resin and silicone resin. A mixture of acrylic resin and melamine resin provides a desirable releasing property. A release layer of silicone resin is advantageous in that it has a superior withstanding capability against solvent, moisture or the like, besides the excellent releasing property.

Figure 4:
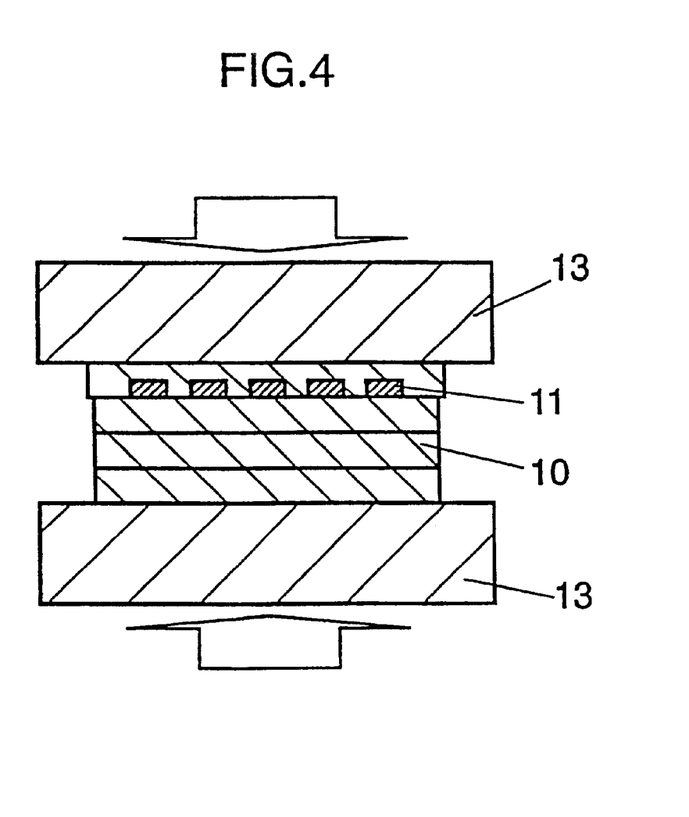
FIG. 4 is a cross sectional view illustrating a process of stacking in an exemplary embodiment of the present invention.
Figure 5:
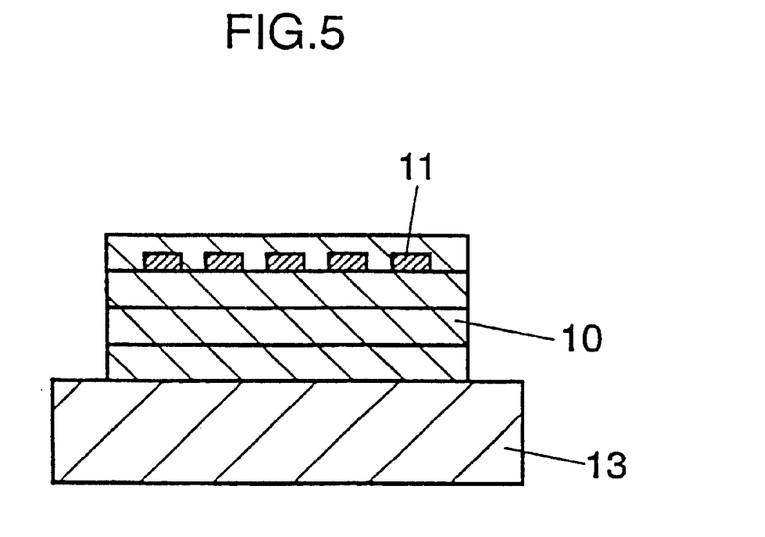
FIG. 5 is a cross sectional view illustrating a process of stacking in an exemplary embodiment of the present invention.

Next, a ceramic sheet 10 is laminated on the conductive layer 11 to be pressed together, as shown in FIG. 4 and FIG. 5. And then, a conductive layer 11 is further laminated thereon to be pressed together under the same conditions, as shown in FIG. 2.

Figure 6:
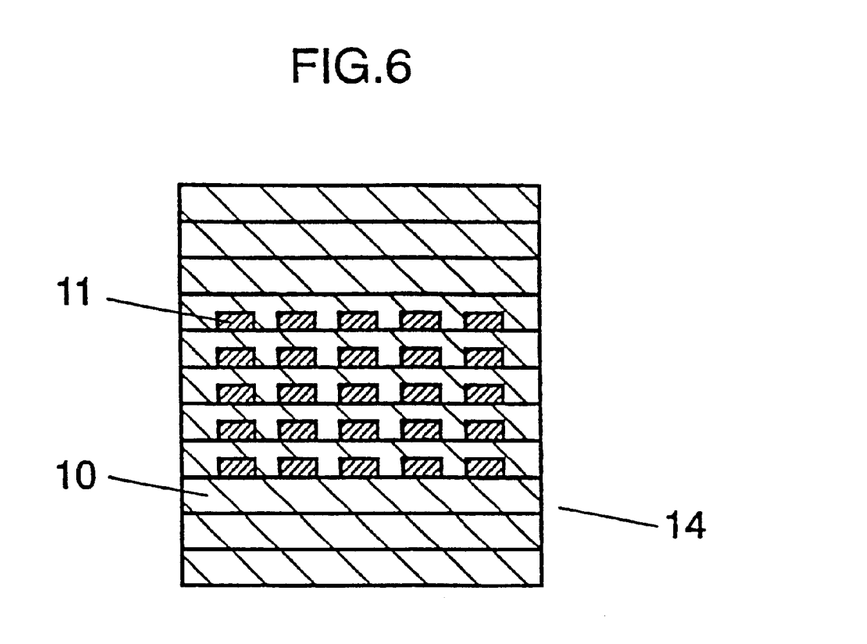
FIG. 6 is a cross sectional view of a provisional laminated body in an exemplary embodiment of the present invention.

The ceramic sheet 10 and the conductive layer 11 are stacked alternately so that the conductive layers 11 face to each other with a ceramic sheet 10 interposed in between, for a certain desired number of layers. Thus a provisional laminated body 14 as shown in FIG. 6 is obtained.

The entire provisional laminated body 14 is pressed and then heated, and then is cut into certain specific shape followed by a removal of the bonding agent and sintering.

Polyethylene component contained in the ceramic sheet 10 melts around the temperature 140° C., when the ceramic sheet 10 starts shrinking. However, the application of the pressure and following heating under the pressure further enhances the adhesive strength between the ceramic sheets 10, as well as that between the ceramic sheet 10 and the conductive layer 11, while suppressing shrinkage of the ceramic sheet 10 in the surface direction.

When removing the bonding agent, it is preferred to first remove the plasticizer contained in multi-layered body, and then raise the temperature to remove the resin. If temperature is raised from the beginning aiming to remove the plasticizer and the resin at the same time, the plasticizer and the resin may react generating a new compound, which would stay within the multi-layered body even after the bonding agent removing process is finished. When a laminated body 14 is sintered, and the compound is burnt to disappear, a structural failure like de-lamination may generate. This leads to a higher defect rate due to a short-circuiting.

During the bonding agent removal and sintering process, the atmosphere and other process conditions need to be adjusted so that the nickel, which later makes itself a conductive layer 2, is not oxidized excessively.

The sintering process provides a sintered body as shown in FIG. 8, where a dielectric layer 1 formed mainly of barium titanate and a conductive layer 2 formed mainly of nickel are sintered. The sintered body is provided with an external electrode 3 made of copper or the like material at both end surfaces, where the conductive layers 2 are exposed. The external electrodes 3 are plated by a known method to complete a finished component.

Second Embodiment

A difference from the first embodiment is that in the second embodiment, the pressing at the third process is not given every time when one ceramic sheet 10 is stacked. Namely, ceramic sheet 10 is simply laminated on the conductive layer 11. Adhesion between the upper and the lower ceramic sheets 10, and between the ceramic sheet 10 and the conductive layer 11 are conducted at the same time at a later step when the conductive layer 11 is pressed after the lamination.

Rest of the manufacturing procedure remains the same as the first embodiment.

Number of pressing operations for forming a provisional laminated body 14 in the present embodiment 2 is halved compared with the first embodiment. One cycle of a pressing operation takes about 1–30 seconds, which means that a substantial amount of time is used for the pressing operation in a component having a large number of layers. Cost for the stacking process is a factor that makes product cost higher. The stacking cost shares a high proportion in the overall cost of finished component; this is significant especially in a component where the conductive layer 2 is formed of a base metal. Thus, halved number of pressing process has a substantial cost reduction effect.

A laminated body manufactured in accordance with the present embodiment contributes to provide a finished component having substantially identical performances as in the first embodiment at a lower cost.

Third Embodiment

A third exemplary embodiment of the present invention is described below referring to the drawings.

A difference compared with the first and the third embodiments is that, in the present embodiment a ceramic sheet 10 and a conductive layer 11 are pressed together in advance to form an integrated sheet of ceramic sheet 10 with conductive layer 11. Then the fabricating operation is conducted by stacking the integrated sheets.

Figure 7:
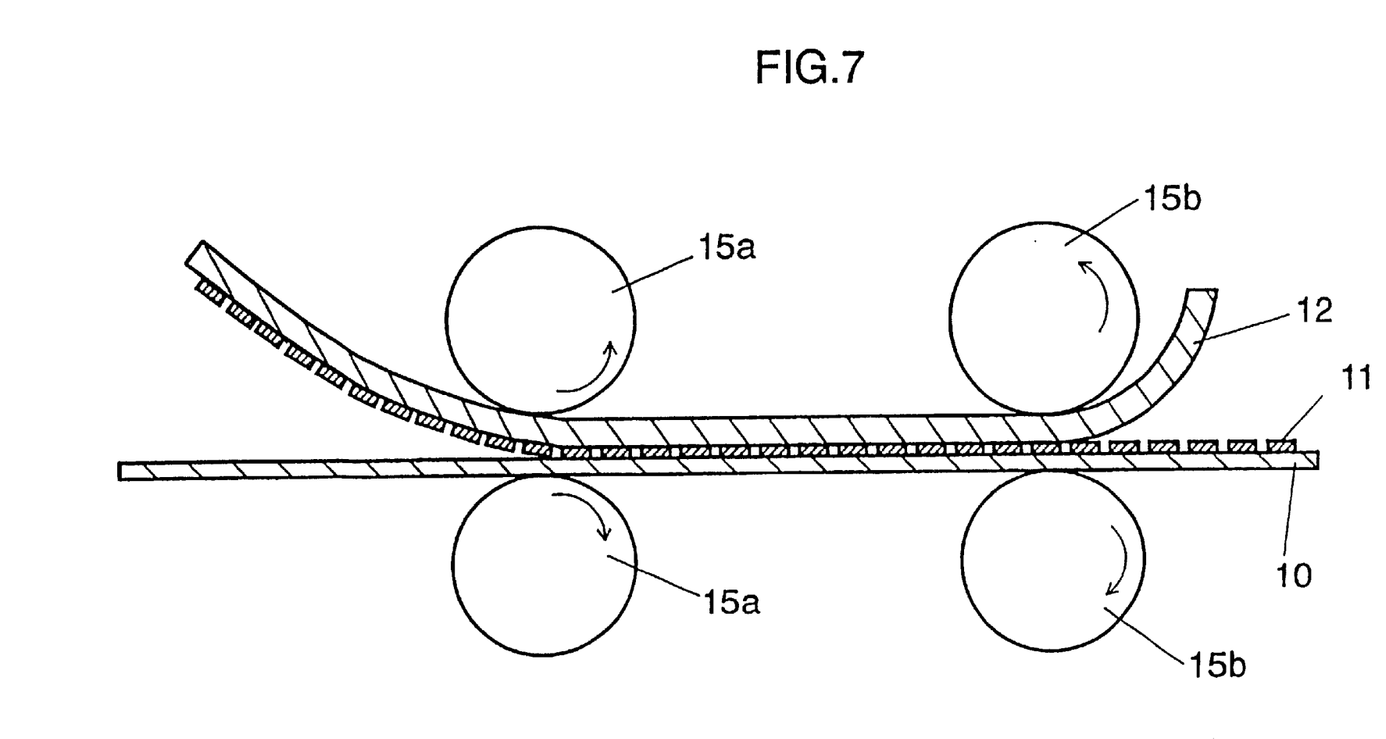
FIG. 7 is a cross sectional view illustrating a manufacturing process in an exemplary embodiment of the present invention.

In the first place, a ceramic sheet 10 and a conductive layer 11 provided on base film 12, which have been manufactured in the same manner as in the first and the second embodiments are disposed together between two rollers 15a,15b, as shown in FIG. 7, for integrating these together by pressing. After the integration, the base film 12 is peeled off, and the rolled sheet is cut into a certain specific shape. An integrated sheet of ceramic sheet 10 with conductive layer 11 is thus provided.

In the same way as in the first embodiment, the integrated sheet of ceramic sheet 10 with conductive layer 11 is stacked and pressed on the protective layer. The integrated sheet stacking operation is repeated until a certain desired number of layers for manufacturing a provisional laminated body 14 is obtained. In a case where the conductive layer 11 is exposed upwards as the result of stacking, it is important to take an appropriate precaution so that the conductive layer 11 does not stick to the upper press plate 13. A practical method is to provide an anti-sticking sheet between the conductive layer 11 and the press plate 13. No such method is needed when ceramic sheet 10 comes to the top surface after the stacking.

Taking thereafter the same processes as those in the first embodiment completes finished components.

The integrated sheet of ceramic sheet 10 with conductive layer 11 can be manufactured quickly by making use of the rollers 15a,15b. Namely, in the present embodiment, the number of press operations at layer stacking has been halved and the cost needed for manufacturing the sheet has been reduced, as compared with the first embodiment. As the result, cost of finished components can be reduced.

In the present embodiment, the ceramic sheet 10 and the conductive layer 11 are pressed together, the base film 12 is peeled off, and then the sheet thus integrated is cut into pieces of certain specific shape to be stacked. However, the base film 12 may be removed instead after the stacked layers are pressed.

Namely, the integrated sheet of ceramic sheet 10 with conductive layer 11 in the present embodiment has a strength enough to withstand the transfer force, or it does not need any reinforcement by a carrier film. Though, in a case where the ceramic sheet 10 is extremely thin, the base film 12 may be retained as it is until the time when the sheet is stacked. By so doing, the sheet transfer will become easier.

Table 1 compares rates of short-circuiting troubles occurred among respective groups of multi-layered ceramic capacitors manufactured in accordance with the first embodiment through the third embodiment and conventional method, each capacitor having 150 effective layers (number of dielectric layers 1 sandwiched by conductive layers 2, in FIG. 8).

TABLE 1

|  | conventional | first embodiment | second embodiment | third embodiment |
| --- | --- | --- | --- | --- |
| short-circuit rates | 52% | 3% | 5% | 4% |

Table 1 teaches us that the rate of short-circuiting troubles is drastically low with the groups of multi-layered ceramic capacitors manufactured in accordance with the first embodiment through the third embodiment, as compared with the group manufactured through conventional manufacturing method. Cross sectional analysis of the short-circuited capacitors showed that the short-circuiting occurred between the conductive layers 2.

Thus the manufacturing method of present invention drastically reduces the short-circuiting troubles between the conductive layers. Production yield of multi-layered ceramic capacitors can therefore be improved significantly, thus enabling the production of low cost products.

Besides those already described in the above exemplary embodiments, the present invention provides additional features as follows:

(1) In describing the embodiments of the present invention, a multi-layered ceramic capacitor has been used as an example. However, the method of manufacturing of the present invention may be applied also to the production of ceramic electronic components such as multi-layered varistors, multi-layered thermistors, multi-layered inductors, multi-layered piezoelectric transformers, multi-layered ceramic substrates or the like, where ceramic sheets and conductive layers are laminated to be a product.

(2) With respect to reducing the short-circuit defects, there is no difference whether the conductive layer is formed with a precious metal or with a base metal. However, in view of cost reduction of finished components, effectiveness of the manufacturing method of the present invention becomes significant when the conductive layer is formed with a base metal.

(3) Effectiveness of the present invention becomes significant with a ceramic sheet of higher porosity. The effectiveness is especially remarkable with the ceramic sheets whose porosity is higher than 30%.

(4) For the purpose of producing a provisional laminated body 14 efficiently, a ceramic sheet 10 and a base film 12 carrying conductive layer 11 formed continuously thereon may be provided in advance respectively in the rolled form.

In such a case, if the base film 12 is provided with a release layer only on one of the surfaces and conductive layer 11 is formed on the release layer, and then it is rolled, the conductive layer 11 gets in touch with the base film 12 at the back surface having no release layer. When it is unrolled, there is a possibility that the conductive layer 11 partially remains sticking on the back surface of base film 12, suffering from a deformation or a breakage. It makes it difficult to make a conductive layer 11 formed precisely on the ceramic sheet 10 in a certain specified shape.

It is preferable to provide release layers on both surfaces of the base film 12, in order to prevent the above-described problem. By so doing, dispersion in the static capacitance of finished multi-layered ceramic capacitors can be suppressed. Such dispersion is caused due to the conductive layer 11 sticking to the base film 12 at the back surface, and staying thereon not being transferred onto the ceramic sheet 10.

In order to prevent the conductive layer 11 from transferred to the back surface of base film 12 , it is preferable that the peel strength of a release layer from the conductive layer 11 is greater with the release layer provided on the front surface of the base film 12 as compared with the other release layer provided on the back surface of the base film 12.

(5) Heating applied during the process of pressing stacked ceramic sheets 10 for manufacturing the provisional laminated body 14 further enhances the adhesion between the ceramic sheet 10 and the conductive layer 11. It is preferable that the heating temperature is not lower than softening point of bonding agent contained in the conductive layer 11 and not higher than the lower temperature of one of softening point of polyethylene and decomposition temperature of the bonding agent.

(6) Although a polyethylene having more than 400,000 of Mw has been used for the resin in ceramic sheet 10 in the above embodiments, the resin is not limited to polyethylene. Conventional olefin polymer materials may be used for the resin. Other materials suitable for the resin include polypropylene and paraffin polymer materials.

A polyethylene having more than 400,000 Mw easily disperses homogeneously in a ceramic sheet. Therefore, it shrinks evenly at stacking, which means the shape of a laminated body is maintained as desired.

INDUSTRIAL APPLICABILITY

In the manufacturing method of the present invention, metallic paste is not printed directly on porous ceramic sheet, but it is first printed on a base film to form a conductive layer, and the conductive layer is later transferred on a ceramic sheet. Thus, the conductive layer is prevented from permeating into the ceramic sheet in the process of the present invention. Therefore, rate of defect among the ceramic electronic components due to short-circuiting can be lowered significantly to an improved yield. Effectiveness of the manufacturing method of the present invention is significant for improving the production yield, when it is applied, among others, to the production of multi-layered chip capacitors, in which a large number of layers are stacked and layer thickness of the ceramic sheet is very thin.

What is claimed is:

1. A method of manufacturing a ceramic electronic component comprising:

a first step of providing a plurality of ceramic sheets having a porosity of 30% or more and comprising ceramic powder and polyethylene, and a first conductor layer containing metal powder, plasticizer and resin formed on a first base film, a second step of laminating and pressurizing the first conductor layer together with the first base film on one of the plurality of ceramic sheets, and peeling off the first base film to form a ceramic sheet with the first conductor layer, a third step of disposing another ceramic sheet on an upper surface of the first conductor layer, a fourth step of laminating and pressurizing a second conductor layer disposed on a second base film on an upper surface of said another ceramic sheet, and peeling off the second base film, the second conductor layer containing metal powder, plasticizer and resin, a fifth step of repeating the third step and the fourth step to form a laminated body having a desired number of layers, and a sixth step of sintering the laminated body.

2. The method of claim 1, wherein said another ceramic sheet is disposed at the third step, and this ceramic sheet is pressurized from the upper surface before the fourth step.

3. The method of claim 1, wherein the second step is preceded by a step of drying the first conductor layer before laminating the first conductor layer on the ceramic sheet.

4. The method of claim 1, further comprising a pressurizing and heating step after the fifth step and before the sixth step.

5. The method of claim 1, wherein the heating temperature is more than the softening point of the resin in each of the first conductor layer and second conductor layer, and less than the lower of the softening point of polyethylene and the decomposition temperature of the resin.

6. The method of claim 1, wherein each of the first conductor layer and second conductor layer is composed of 5 to 15 parts by weight of the total of the resin and plasticizer in 100 parts by weight of the metal component.

7. The method of claim 1, wherein a first release layer is formed between the first conductor layer and the first base film.

8. The method of claim 1, wherein the first release layer is formed of at least one selected from the group consisting of acrylic resin, melamine resin, epoxy resin, and silicone resin.

9. The method of claim 7, wherein a second release layer is formed on the first base film on a surface opposite to the surface of the first base film on which the first release layer and the conductor layer are formed, the first release layer having a greater adhesive strength than the second release layer.

10. The method of claim 1, wherein pressurizing is accompanied by heating at the second and fourth steps.

11. The method of claim 10, wherein the heating temperature is more than the softening point of the resin in the conductor layer, and less than the lower of the softening point of polyethylene and the decomposition temperature of the resin.

12. A method of manufacturing a ceramic electronic component comprising:

a first step of providing a plurality of ceramic sheets having a porosity of 30% or more and comprising ceramic powder and polyethylene, and a conductor layer containing metal powder, resin and plasticizer formed on a base film, a second step of stacking the plurality of ceramic sheets and then laminating and pressurizing the conductor layer together with the base film on the stack of ceramic sheets, and peeling off the base film to form a ceramic sheet with conductor layer, a third step of laminating the stack of ceramic sheets with the conductor layer laminated thereon to form a laminated body, and a fourth step of sintering the laminated body.

13. A method of manufacturing a ceramic electronic component comprising:

a first step of providing a plurality of ceramic sheets having a porosity of 30% or more and comprising ceramic powder and polyethylene, and providing a plurality of conductor layers, each conductive layer containing metal powder, resin and plasticizer formed on a base film, a second step of stacking a plurality of the plurality of ceramic sheets, a third step of disposing one of the plurality of ceramic sheets on an upper surface of the stack of ceramic sheets, a fourth step of laminating and pressurizing one of the plurality of conductor layers together with a base film on the disposed ceramic sheet, and peeling off the base film to form a ceramic sheet with conductor layer, a fifth step of repeating the third step and fourth step to form a laminated body having a desired number of layers, and a sixth step of sintering the laminated body.

14. The method of claim 13, wherein the conductor layers are dried before the fourth step.

15. The method of claim 13, wherein each of the plurality of conductor layers is composed of 5 to 15 parts by weight of the total of the resin and plasticizer in 100 parts by weight of the metal component.

16. The method of claim 13, wherein a first release layer is formed between the conductor layer and the base film.

17. The method of claim 16, wherein the first release layer is formed of at least one selected from the group consisting of acrylic resin, melamine resin, epoxy resin, and silicone resin.

18. The method of claim 16, wherein a second release layer is formed on the base film on a surface opposite to the surface of the base film on which the first release layer and the conductor layer are formed, the first release layer having a greater adhesive strength than the second release layer.

19. The method of claim 13, wherein the laminated body is pressurized and then heated after the fifth step and before the sixth step.

20. The method of claim 19, wherein the heating temperature is more than the softening point of the resin in the conductor layer, and less than the lower of the softening point of polyethylene and the decomposition temperature of the resin.

21. The method of claim 13, wherein pressurizing is accompanied by heating at the fourth step.

22. The method of claim 21, wherein the heating temperature is more than the softening point of the resin in the conductor layer, and less than the lower of the softening point of polyethylene and the decomposition temperature of the resin.

* * * * *